United States Patent [19]
Takahashi

[11] Patent Number: 5,452,254
[45] Date of Patent: Sep. 19, 1995

[54] SEMICONDUCTOR MEMORY DEVICE

[75] Inventor: Hiroyuki Takahashi, Tokyo, Japan

[73] Assignee: NEC Corporation, Tokyo, Japan

[21] Appl. No.: 317,600

[22] Filed: Sep. 29, 1994

[30] Foreign Application Priority Data

Sep. 29, 1993 [JP] Japan .................. 5-268199

[51] Int. Cl.[6] .............................. G11C 7/02
[52] U.S. Cl. ...................... 365/207; 365/190
[58] Field of Search ............ 365/207, 190, 208, 203; 307/530; 327/51, 52

[56] References Cited

U.S. PATENT DOCUMENTS 4,558,434 12/1985 Baba ..................... 365/190
4,939,693 7/1990 Tran ..................... 365/207

FOREIGN PATENT DOCUMENTS 63-9095 1/1988 Japan .
090,632 10/1983 EU .
449,282 10/1991 EU .

Primary Examiner—A. Zarabian
Attorney, Agent, or Firm—Whitham, Curtis, Whitham & McGinn

[57] ABSTRACT

In a semiconductor memory circuit, when a memory cell is not selected, a pair of complementary data lines connected to the memory cell are short-circuited to be brought to the same potential, and when the memory cell is selected, the short-circuiting is cancelled. Therefore, the complementary data lines are in no way put in a floating condition, and when the memory cell is selected, a voltage difference corresponding to the data to be read out is immediately generated between the complementary data lines. Accordingly, the data is quickly fixed or settled, without being influenced by a preceding read-out data.

6 Claims, 5 Drawing Sheets

SEMICONDUCTOR MEMORY DEVICE

BACKGROUND OF THE INVENTION

1. Field of the Invention

The present invention relates to a semiconductor memory device, and more specifically to a semiconductor memory device having a pair of data lines for outputting a content of a memory cell in the form of a differential signal.

2. Description of Related Art

Referring to FIG. 1, there is shown a circuit diagram, corresponding to one bit, of one example of a conventional semiconductor memory device, in which a bipolar differential amplifier circuit is connected to a static memory cell. In the shown example, a pair of complementary digit lines D and DB are pulled up through resistors R1 and R2 to a high voltage supply voltage Vcc, and a memory cell MC is connected between the pair of digit lines D and DB and also connected to a word line WL, so that when the memory cell MC is selected by the word line WL, a content of the memory cell MC is outputted to the pair of digit lines D and DB in the form of a differential voltage signal.

The pair of digit lines D and DB are also connected to a sense amplifier 10, which amplifies the output of the memory cell MC read out on the pair of digit lines D and DB, and supplies the amplified output to a multiplexor and current-to-voltage conversion amplifier circuit 12.

The sense amplifier 10 includes a pair of NPN bipolar transistors Q11 and Q12 having their base connected to the pair of digit lines D and DB, respectively. A collector of each of the bipolar transistors Q11 and Q12 is connected to a high voltage supply voltage Vcc. Emitter of the bipolar transistors Q11 and Q12 are connected to a pair of complementary data lines W and WB, respectively. The pair of data lines W and WB are connected to a drain of a pair of source-grounded N-channel MOS transistors M11 and M12, respectively, which have a gate connected to receive a sense amplifier selection signal YS, so that each of the N-channel MOS transistors M11 and M12 constitutes a constant current source for the bipolar transistors Q11 and Q12. Therefore, the bipolar transistors Q11 and the N-channel MOS transistor M11 constitute an emitter follower circuit, and the bipolar transistor Q12 and the N-channel MOS transistor M12 constitute another emitter follower circuit.

In addition, the pair of dale lines W and WB are respectively connected to a base of a pair of NPN bipolar transistors Q13 and Q14, which have their emitter connected in common to a drain of source-grounded N-channel MOS transistor M13. A gate of the MOS transistor M13 is connected to receive the selection signal YS, so that the N-channel MOS transistor M13 constitutes a constant current source. A collector of each of the pair of NPN bipolar transistors Q13 and Q14 is connected to the multiplexor and amplifier circuit 12. Therefore, the NPN bipolar transistors Q13 and Q14 constitute a differential amplifier, so that an output signal is outputted, in the form of a differential current, from the collector of the NPN bipolar transistors Q13 and Q14. The output signal is selected and level-adjusted in the multiplexor and current-to-voltage conversion amplifier circuit 12, so that a read-out data signal DOUT is outputted from the multiplexor and amplifier circuit 12.

Now, operation of the above mentioned semiconductor memory device will be explained.

A voltage amplitude of a signal read out from the memory cell MC onto the digit lines D and DB, which are at an operation voltage near to the high voltage supply voltage Vcc, is extremely small such as a few ten millivolts to a few hundred millivolts. The sense amplifier 10 receiving the extremely small voltage, converts the extremely small voltage to a low voltage on the order of about 0.8 V, by action of a level shifting emitter follower circuit including the N-channel MOS transistors M11 and M12. The low voltage appears on the pair of data lines W and WB, and is inputted to the differential amplifier composed of the bipolar transistors Q13 and Q14.

However, a voltage difference between the pair of data lines W and WB is extremely small similarly to the voltage difference between the pair of digit lines D and DB. Therefore, an effective circuit can be obtained by constituting the differential amplifier by high sensitive bipolar transistors. On the other hand, the emitter follower circuits including the N-channel MOS transistors are inserted for obtaining the input voltage suitable to the differential amplifier and for electrically separating a signal line load of the differential amplifier circuit from the digit line.

The output of the differential amplifier is supplied from the collector of the bipolar transistors Q13 and Q14, in the form of a differential current, to the multiplexor and amplifier circuit 12. In the multiplexor and amplifier circuit 12, there are provided a plurality of amplifying circuits, and a constant current flows in only a selected one of the plurality of amplifying circuits, for the purpose of selecting one signal from the input signals and transferring the selected input signal. Of course, a current source for the differential output current is given by the constant current source circuit composed of the N-channel MOS transistor M13 for the differential amplifier. However, when the sense amplifier is not selected, the constant current source circuits for the emitter followers are turned off, and therefore, a consumed electric current is reduced. Otherwise, a current would flow through the emitter follower circuits of all of a large number of differential amplifier circuits, so that a consumed electric power of an overall semiconductor device would inevitably increase.

In the above mentioned conventional semiconductor memory device, when the sense amplifier circuit 10 is selected by the selection signal YS, the constant current begins to flow through the emitter follower circuits. Accordingly, after respective potentials of the data lines W and WB of the emitter follower circuits, which are the input signals supplied to the differential amplifier, have been fixed or settled, the differential amplifier begins to operate.

On the other hand, in a non-selected emitter follower circuits in which the constant current does not flow, the bipolar transistors Q11 and Q12 are in an off condition, and therefore, the potentials of the data lines W and WB are not fixed. This means that the last read-out potential information remains on the the data lines W and WB, or the data lines W and WB assume an indefinite potential due to noises and other factors. Namely, this means that the potentials of the data lines W and WB are in a floating condition. In this condition, if the sense amplifier is selected, a delay occurs until a normal or proper read-out potential information is fixed or settled on the data lines W and WB.

A recent increased memory integration density results in an increased load capacitance of the signal lines of the emitter follower circuit, and therefore, a potential fixing or settling time increases. This is a large hindrance in realizing a high speed operation.

SUMMARY OF THE INVENTION

Accordingly, it is all object of the present invention to provide a semiconductor memory device overcomes the above mentioned defects of the conventional devices.

Another object of the present invention is to provide a semiconductor memory device capable of shortening the potential fixing time of the data lines when the corresponding sense amplifier is selected.

The above and other objects of the present invention are achieved in accordance with the present invention by a semiconductor memory device comprising a pair of complementary data lines for outputting a content of a memory cell in the form of a pair of differential signals, an amplifying means for detecting and amplifying the pair of differential signals, an enable means for selectively enabling and disabling the amplifying means, a floating means for maintaining the pair of complementary data lines in a floating condition when the amplifying means is put in a disabled condition by the enable means, and a short-circuit means for short-circuiting the pair of complementary data lines in the floating condition when the amplifying means is put in the disabled condition.

The short-circuit means short-circuits the pair of complementary data lines in synchronism with an enable signal for putting the amplifying means into an enabled condition. For example, the amplifying means includes a differential circuit composed of a pair of bipolar transistors having their base connected to the pair of complementary data lines, respectively, and the enable means includes a level converting means receiving the enable signal to convert a level of the enable signal. Preferably, the semiconductor memory device further includes a delay means receiving the enable signal to delay the enable signal in correspondence to a delay time occurring in the level converting means, the delayed enable signal being supplied to the short-circuiting means.

In one embodiment, the floating means includes a pair of emitter follower transistors having their base connected to receive a pair of differential signals read from the memory cell, respectively, and a pair of current sources connected to an emitter of the emitter follower transistors and on-off controlled in response to the enable signal. Furthermore, the pair of complementary data lines can be connected through a wired-OR to a plurality of pairs of emitter follower transistors.

In addition, the semiconductor memory device further includes a short-circuit canceling means for canceling the short-circuiting between the pair of complementary data lines after a potential on the pair of complementary data lines changes in accordance with the pair of differential signals read from the memory cell.

According to another aspect of the present invention, there is provided a semiconductor memory device comprising a pair of emitter follower means for outputting a content of a memory cell in the form of a pair of differential signals, a pair of complementary data lines connected to an output of the pair of emitter follower means, a bipolar differential amplifier means for detecting and amplifying the pair of differential signals on the pair of complementary data lines, an enable means for selectively enabling and disabling the differential amplifier means, and a short-circuit means for short-circuiting the pair of complementary data lines when the differential amplifier means is in a disabled condition, and also for setting the pair of complementary data lines to a predetermined voltage.

This predetermined voltage is preferably a voltage near to an emitter bias voltage of the emitter follower means when the emitter follower means is in operation.

The above and other objects, features and advantages of the present invention will be apparent from the following description of preferred embodiments of the invention with reference to the accompanying drawings.

DESCRIPTION OF THE PREFERRED EMBODIMENTS

Figure 1:
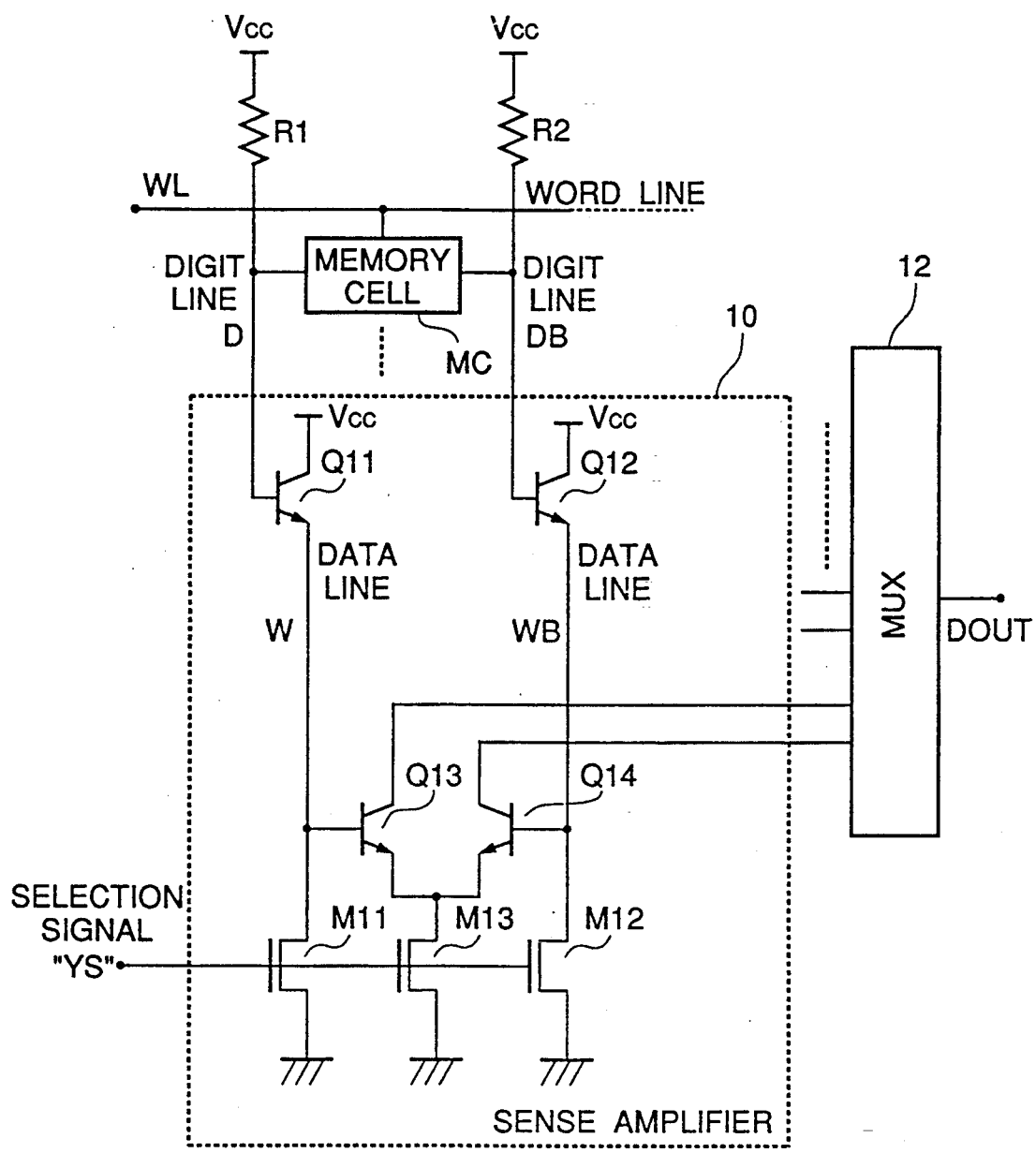
FIG. 1 is a circuit diagram of an essential part, corresponding to one bit, of a conventional semiconductor memory device.
Figure 2:
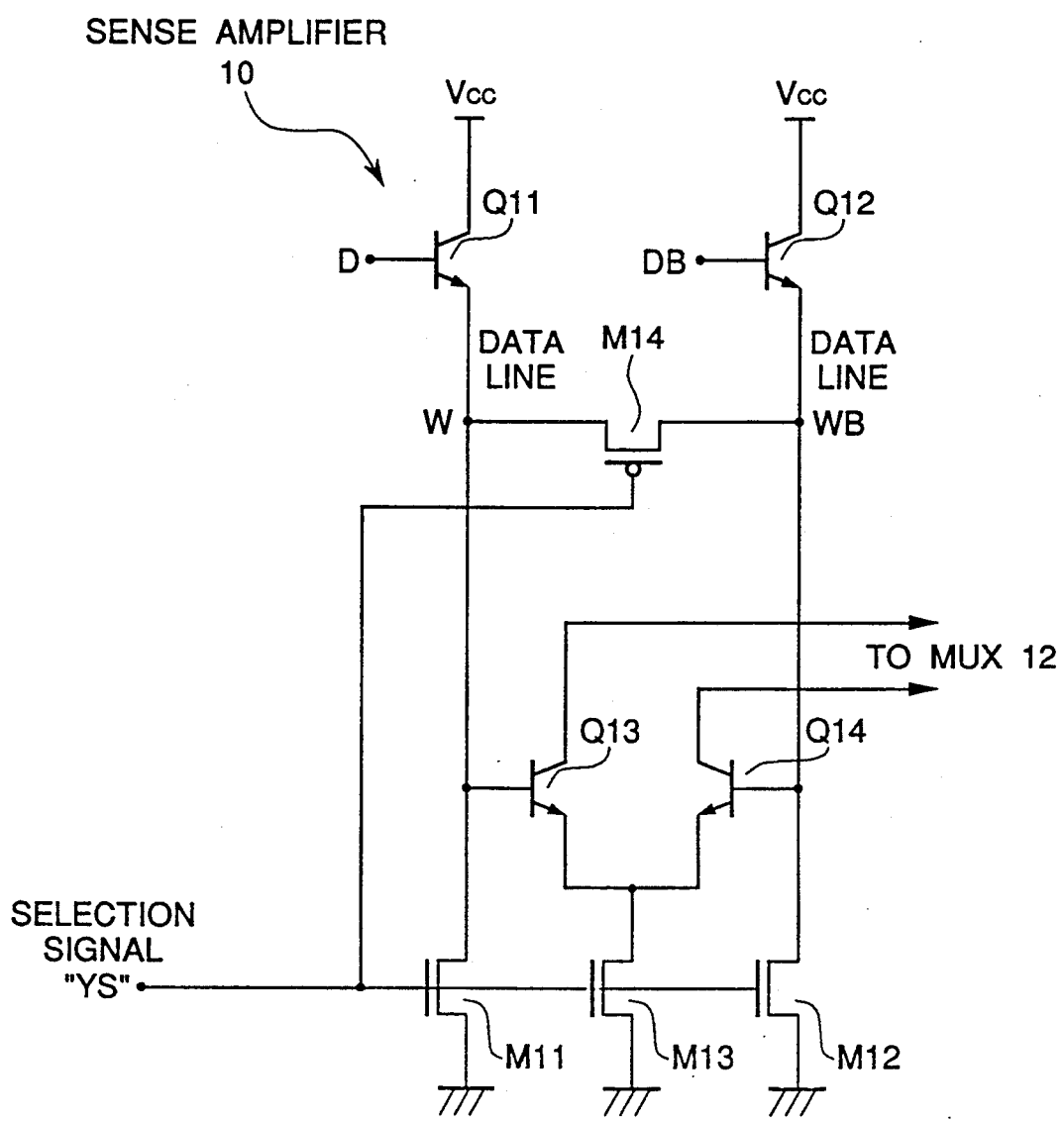
FIG. 2 is a circuit diagram of an essential part, corresponding to one bit, of a first embodiment of the semiconductor memory device in accordance with the present invention.

Referring to FIG. 2, there is a circuit diagram of an essential part, corresponding to one bit, of a first embodiment of the semiconductor memory device in accordance with the present invention. In FIG. 2, elements corresponding to those shown in FIG. 1 are given the same Reference Numerals, and explanation thereof will be omitted for simplification of description.

As will be apparent from comparison between FIGS. 1 and 2, the first embodiment is different from the conventional example in that a P-channel MOS transistor M14 is connected between the pair of complementary data lines W and WB, a gate of the MOS transistor M14 being connected to receive the selection signal YS. When the sense amplifier 10 is not selected, since the selection signal YS is at a logical low level, the P-channel MOS transistor M14 is turned on, so that the pair of complementary data lines W and WB are short-circuited. As a result, the the pair of complementary data lines W and WB are no longer in a floating condition.

With the above mentioned arrangement, the selection signal YS is at a logical high level in order to select one sense amplifier 10 from a plurality of sense amplifiers (not shown). A voltage amplitude of a signal read out from the memory cell MC onto the digit lines D and DB (shown in FIG. 1), which are al an operation voltage near to the high voltage supply voltage Vcc, is extremely small such as a few ten millivolts to a few hundred millivolts, as mentioned hereinbefore in connection with the conventional example. The sense amplifier 10 receiving the extremely small voltage, converts the extremely small voltage to a low voltage on the order of about 0.8 V, by action of a level shifting emitter follower circuit. This low voltage appearing on the pair of data lines W and WB, is inputted to the differential amplifier composed of the bipolar transistors Q13 and Q14. At this time, since the selection signal YS is at the logical high level as mentioned above, the P-channel MOS transistor M14 is off, and therefore, the output signal appearing on the pair of data lines W and WB is subjected to no influence from the P-channel MOS transistor M14.

A voltage difference between the pair of data lines W and WB is applied to the bipolar differential amplifier circuit composed of the bipolar transistors Q13 and Q14. This bipolar differential amplifier circuit operates to output the constant current supplied from the constant current transistor M13, from the collector of only one of the bipolar transistors Q13 and Q14 determined by the small voltage difference between the base input potentials of the bipolar transistors Q13 and Q14. At this time, since only the selection signal YS corresponding to the sense amplifier to be selected is at a logical high level in order to select one from a plurality of sense amplifiers, the information read out from the memory cell is selected and transferred by causing the constant current to flow through the sense amplifier.

On the other hand, when the sense amplifier 10 is not to be selected, the corresponding selection signal YS is maintained at the logical low level, and therefore, not only the constant current MOS transistor M13 for the bipolar differential amplifier circuit but also the constant current MOS transistors M11 and M12 for the emitter follower circuits are off, so that the consumed electric current is reduced. At this time, since the bipolar transistors Q11 and Q12 of the emitter follower circuits are also off, the most recent potentials when the bipolar transistors Q11 and Q12 were on, are preserved. However, when the sense amplifier 10 is not to be selected, since the P-channel MOS transistor M14 is rendered on, the data lines W and WB of the emitter follower circuits are short-circuited, and therefore, brought into the same potential level.

Namely, in a non-selected condition, the data lines W and WB are forcibly brought into a completely intermediate data condition, so that, when the data lines W and WB are selected in future, the influence of the most recent data potentials when the bipolar transistors Q11 and Q12 were on, has already completely been eliminated.

Incidentally, it is sufficient if the MOS transistor M14 has a size sufficient to cancel or neutralize the extremely small voltage amplitude on the data lines W and WB (or the extremely small voltage difference between the data lines W and WB) during each cycle (sense amplifier selection period). Therefore, it would be understandable that the MOS transistor M14 is not required to have a large size. Accordingly, almost no delay occurs because of this MOS transistor M14 connected to the data lines W and WB.

Figure 3:
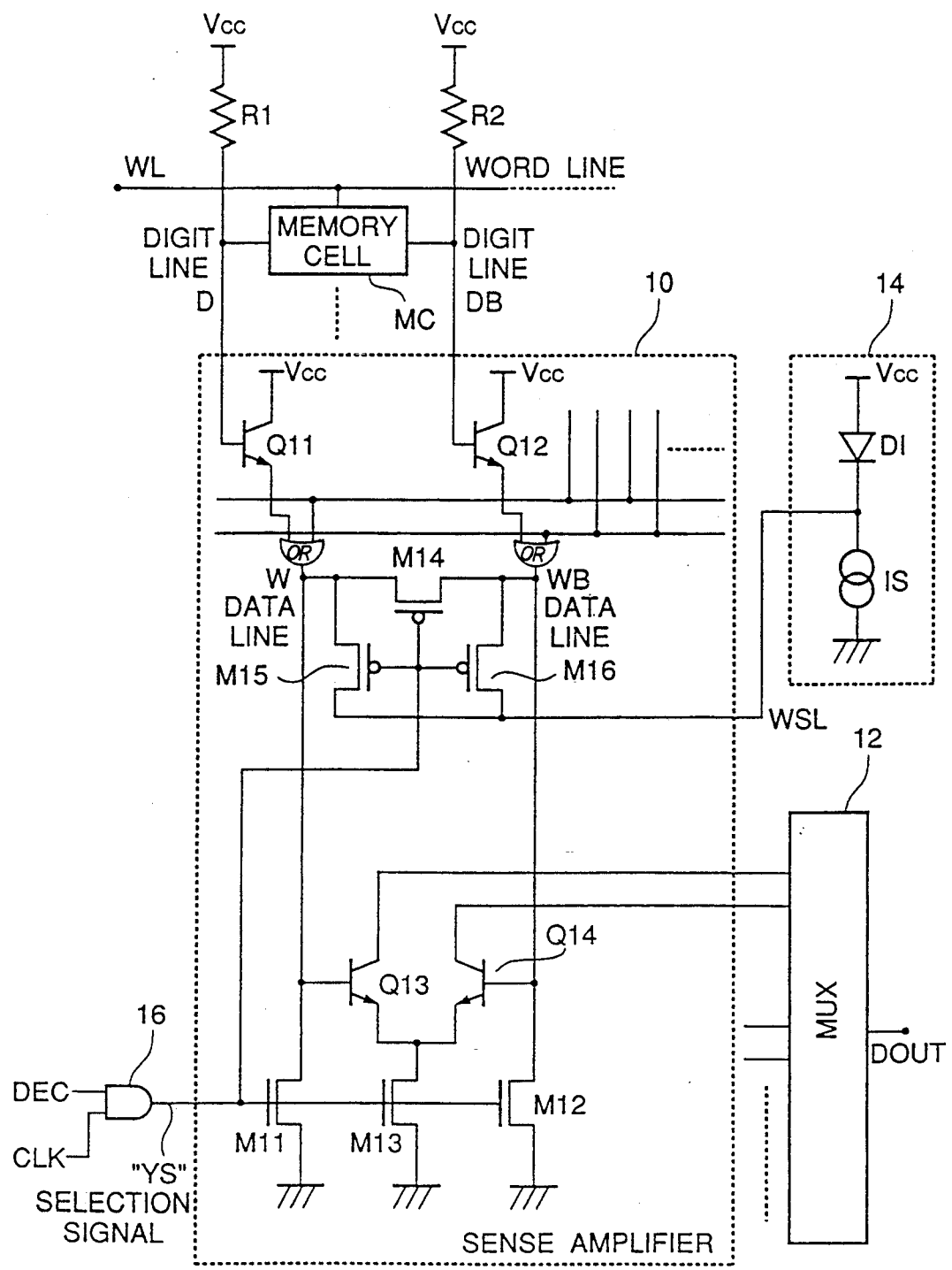
FIG. 3 is a circuit diagram of an essential part, corresponding to one bit, of a second embodiment of the semiconductor memory device in accordance with the present invention.

Referring to FIG. 3, there is a circuit diagram of an essential part, corresponding to one bit, of a second embodiment of the semiconductor memory device in accordance with the present invention. In FIG. 3, elements corresponding to those shown in FIGS. 1 and 2 are given the same Reference Numerals, and explanation thereof will be omitted for simplification of description.

In the second embodiment, the pair of digit lines D and DB are connected to the sense amplifier 10, but the pair of emitter follower circuits are composed of not only the bipolar transistors Q11 and Q12 having their base connected to the digit lines D and DB, and their emitter connected to the data lines W and WB, respectively, but also a plurality of pairs of bipolar transistors (not shown). In other words, the non-inverted data Line W is connected to not only the emitter of the transistor Q11 but also an emitter of other bipolar transistors (not shown) each of which has a base connected to a different non-inverted digit line (not shown), and the inverted data line WB is connected to not only the emitter of the transistor Q12 but also an emitter of other bipolar transistors (not shown) each of which has a base connected to a different inverted digit line (not shown).

Therefore, a well known wired OR is constituted on the connection node between the data line W or WB and the emitter of the transistor Q11 or Q12 and the emitter of the other bipolar transistors (not shown). Accordingly, each of the data lines W and WB has a load capacitance much larger than that of the data lines W and WB in the first embodiment. In this case, the previously mad-out data remaining on the dam lines W and WB has a further large influence.

In view of this circumstance, and in order to enable to read data at a higher speed when selected, not only the P-channel MOS transistor M14 is connected between the pair of data lines W and WB, but also a constant voltage WSL generated by a constant voltage generating circuit 14, is connected to the data lines W and WB through P-channel MOS transistors M15 and M16, respectively.

This constant voltage generating circuit 14 is composed of a diode DI having an anode connected to a high voltage supply voltage Vcc and a cathode connected through a current source IS to ground, a connection node between the diode DI and the current source IS generating the above mentioned constant voltage WSL, which is lower than the high voltage supply voltage Vcc by a forward-direction drop voltage of the diode DI. This constant voltage WSL is intended to be substantially equal to the voltage appearing on the data lines when the sense amplifier is selected.

A gate of the P-channel MOS transistors M15 and M16 are connected to receive the selection signal YS, which is, in this second embodiment, outputted from an AND gate 16 receiving a decoder signal DEC and a clock signal CLK generated in an internal of the memory device or supplied from an external.

Even in the second embodiment in which the data lines W and WB are connected through the wired-OR circuits to a plurality of pairs of digit lines including the digit lines D and DB, and therefore, sustain a large load capacitance, since the sense amplifier is constituted of the bipolar transistors, it is possible to read data at a speed higher than that of a sense amplifier composed of only MOS transistors. In addition, since the sense amplifier is constituted of the bipolar transistors, the sense amplifier has an amplification power higher than that of a sense amplifier composed of only MOS transistors.

Accordingly, it is sufficient if the level of the input signal applied to the sense amplifier is on the order of 1/10 to 1/100 of the level of an input signal applied to a sense amplifier composed of only MOS transistors. In other words, since the level of the input signal applied to the sense amplifier may be greatly smaller than a sense amplifier composed of only MOS transistors, even if a precharged level of the data lines is different, there does not occur a variation in the output speed from the sense amplifier.

As mentioned above, similarly to the MOS transistor M14, the selection signal YS is applied to the gate of each of the MOS transistors M15 and M16. Therefore, in the non-selected condition, the MOS transistors M15 and M16 are turned on. Accordingly, the data lines W and WB are fixed or settled to the constant voltage WSL, and therefore, the potential of the dam lines W and WB will never vary under influence of noise or other external factors. Thereafter, when the sense amplifier is selected, since it is unnecessary to elevate the potential of the data lines W and WB to an operating potential region, the read-out potential information can be immediately outputted.

Figure 4:
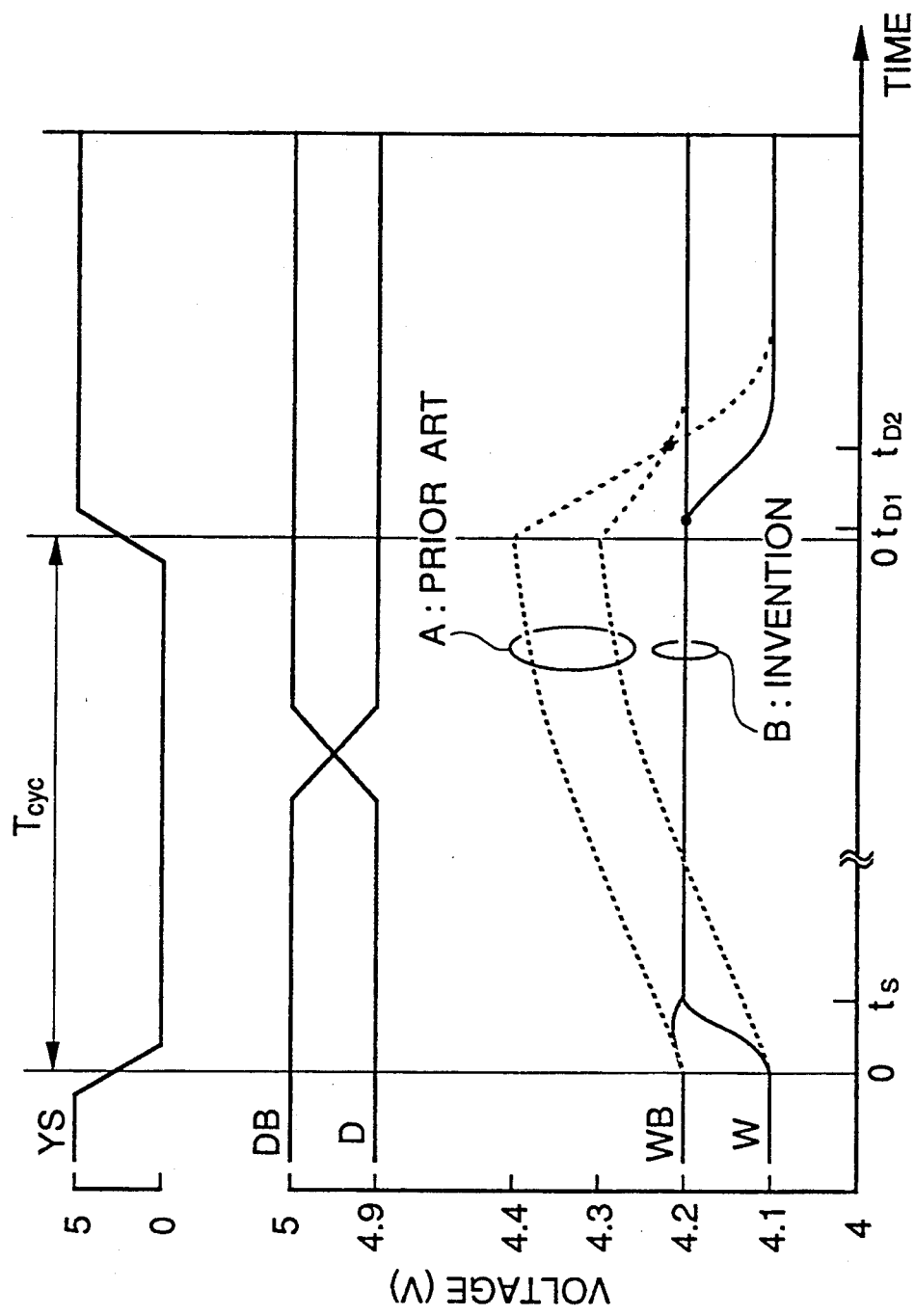
FIG. 4 is a waveform diagram illustrating an operation of the semiconductor memory device in accordance with the present invention.

Referring to FIG. 4, there is shown a waveform diagram illustrating a voltage change at different points in the circuit shown in FIG. 3. FIG. 4 shows that the selection signal YS is maintained at a non-selecting level or at a logical low level during one cycle time Tcyc, and then, brought to a selecting level or a logical high level during a cycle next to the cycle time Tcyc.

The pair of digit lines D and DB operate at a potential near to Vcc=5 V with a voltage difference on the order of 100 mV. In the non-selected condition even if the potential level on the digit lines D and DB flips or inverts as shown in FIG. 4, this potential inversion does not appear on the data lines W and WB, which are at a level of $\{Vcc-0.8 V\}$.

In the conventional circuit as shown in FIG. 1, when the selection signal YS is put in a disable condition (namely, at the logical low level), since the current flowing through the bipolar transistors decreases, the potential on the data lines W and WB slowly elevates with a large time constant while maintaining the voltage difference between the data lines W and WB when the sense amplifier was selected, as shown by the dotted lines A in FIG. 4. Accordingly, if in a next selected condition, the data opposite to the data read out in the preceding selected condition is read out, a substantial inverting time $t_{D2}$ is required from the moment the selection signal is enabled until the moment the voltage large-and-small relation flips or inverts between the data lines W and WB.

In the second embodiment, on the other hand, just after the sense amplifier is put in a non-selected condition (or just after the selection signal YS is disabled to the logical low level), the data lines W and WB are short-circuited by the P-channel MOS transistor M14, and are also fixed to an equipotential level near to the high voltage supply voltage Vcc through the P-channel MOS transistors M15 and M16, with a time $t_s$ as shown by a solid line B in FIG. 4. As depicted in FIG. 4, this time $t_s$ is preferred to be sufficiently shorter than a length of one read cycle Tcyc, but it may be sufficient if the time $t_s$ is substantially shorter than the length of one read cycle Tcyc.

Accordingly, when the sense amplifier is selected in a cycle next to the non-selected cycle Tcyc, a potential difference corresponding to the read-out data immediately begins to appear between the data lines W and WB with only a very short delay time $t_{D1}$. In this embodiment, the time from the moment the sense amplifier is selected to the moment the read-out data is outputted to the amplifier and multiplexor 12 can be shortened by 20% to 50% in comparison with the conventional circuit.

Figure 5:
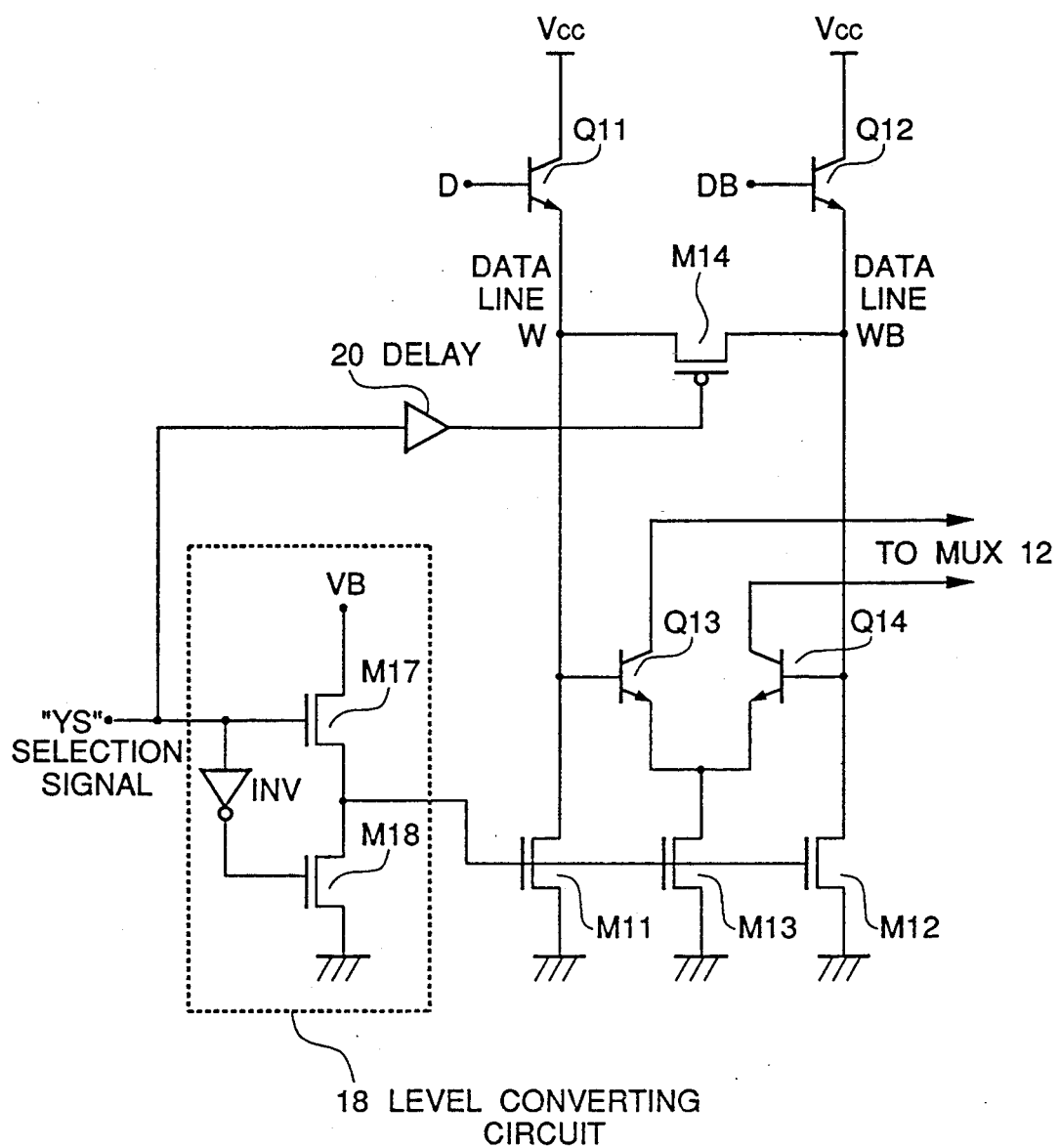
FIG. 5 is a circuit diagram of an essential part, corresponding to one bit, of a third embodiment of the semiconductor memory device in accordance with the present invention.

Referring to FIG. 5, there is a circuit diagram of an essential part, corresponding to one bit, of a third embodiment of the semiconductor memory device in accordance with the present invention. In FIG. 5, elements corresponding to those shown in FIGS. 1, 2 and 3 are given the same Reference Numerals, and explanation thereof will be omitted for simplification of description.

As seen from comparison between FIGS. 2 and 5, the third embodiment is characterized in that there is provided a level convening circuit 18 receiving the selection signal YS for converting the voltage level of the selection signal YS into a different voltage level, which is actually applied to the gate of the constant current. MOS transistors M11, M12 and M13. This level converting circuit 18 includes a pair of N-channel MOS transistors M17 and M18 connected in series between a constant voltage VB and ground (VEE), a gate of the transistor M17 being connected to receive directly the selection signal YS, and an inverter INV having an input connected to receive the selection signal YS and an output connected to a gate of the transistor M18. The constant voltage VB is smaller than the high voltage supply voltage Vcc.

In addition, the selection signal YS is supplied through a delay circuit 20 to the gate of the P-channel MOS transistor M14.

With the above mentioned construction, the selection signal YS for selecting the sense amplifier including the bipolar transistors Q13 and Q14, is level-converted by the level converting circuit 18, and then, applied to the gate of the constant current N-channel MOS transistors M11, M12 and M13 for the emitter followers and the differential amplifier. Here, the level converting circuit 18 includes a switching circuit composed of the N-channel MOS transistors M17 and M18 connected in series between the constant voltage VB and ground (VEE), the gate of the MOS transistor M17 receiving the selection signal YS, and the gate of the MOS transistor M18 receiving an inverted signal of the selection signal YS.

On the other hand, the selection signal YS is also applied through the delay circuit 20 to the gate of the P-channel MOS transistor M14 for short-circuiting between the data lines W and WB. This delay circuit 20 functions to adjust the delay time of the selection signal YS applied to the gate of the P-channel MOS transistor M14, in order to facilitate the reading operation of the sense amplifier.

Namely, in the case that the level converting circuit 18 is provided, the turning-off/turning-on timing of the MOS transistor M13 is deviated or shifted from the ennobling/disabling timing of the sense amplifier. Specifically, in some cases, the timing of the transfer of data from the digit lines D and DB to the data lines W and WB is delayed from the level transition timing of the selection signal YS. Here, referring to FIG. 4, the data on the digit lines D and DB flips before the selection signal YS is enabled to the logical high level. However, provision of the level converting circuit 18 causes the possibility that after the selection signal YS is enabled to the logical high level, the data on the digit lines D and DB flips. In this case, the data before the data on the digit lines D and DB flips is supplied to the data lines W and WD, and is read out for a time.

In order to avoid the above mentioned inconvenience, the delay circuit 20 is set to have a large delay time, in order to ensure that the data lines W and WB are maintained at an equipotential for a time after the sense amplifier has been selected (namely, the selection signal YS has been enabled to the logical high level), and thereafter, the transistor M14 is turned off, namely, the short-circuiting between the data lines W and WB is cancelled, in synchronism with the flipping of the data on the digit lines D and DB. With this arrangement, it is possible to read out the data as soon as the data on the digit lines D and DB is fixed or settled, with no possibility of reading out the preceding data. Accordingly, high speed reading becomes possible.

On the other hand, in the case that, as shown in FIG. 4, the data on the digit lines D and DB flips before the selection signal YS is enabled to the logical high level, the delay time of the delay circuit 20 is made small so that the transistor M14 is turned off (namely, the short-circuiting between the data lines W and WB is cancelled) during a period from the moment the data on the digit lines D and DB flips to the moment the selection signal YS is enabled to the logical high level. In this situation, a high speed reading becomes possible.

As well known to persons skilled in the art, the delay circuit 20 can be constituted of a CMOS (complementary MOS) circuit. If it is necessary to adjust the delay time of the turning-on timing of the transistor M14 and the delay time of the turning-off timing of the transistor M14, independently of each other, it is sufficient if the size of an N-channel MOS transistor and the size of a P-channel MOS transistor in the CMOS circuit are determined independently of each other.

As seen from the above, the present invention is characterized in that, when the memory cell is not selected, the complementary data lines connected to the memory cell are short-circuited to be brought to the same potential, and when the memory cell is selected, the short-circuiting is cancelled. Therefore, the complementary data lines are in no way put in a floating condition, and when the memory cell is selected, a voltage difference corresponding to the data to be read out is immediately generated between the complementary data lines. Accordingly, the data is quickly fixed or settled, without being influenced by a preceding read-out data.

In addition, since the complementary data lines are short-circuited by utilizing the selection signal in response to the timing where the selection signal is disabled, a separate pulse for short-circuiting the complementary data lines is unnecessary, and therefore, it is not necessary to provide a circuit for generating the pulse for short-circuiting. Accordingly, the chip size is subjected to almost no influence.

Furthermore, after the potentials on the pair of complementary digit lines have inverted or flipped, the short-circuiting between the complementary data lines is cancelled. Therefore, it it possible to realize a high speed reading without reading the preceding data.

The invention has thus been shown and described with reference to the specific embodiments. However, it should be noted that the present invention is in no way limited to the details of the illustrated structures but changes and modifications may be made within the scope of the appended claims.

I claim:

1. A semiconductor memory device comprising;
    a pair of complementary data lines for outputting a content of a memory cell in the form of a pair of differential signals;
    amplifying means for detecting and amplifying said pair of differential signals;
    enable means for selectively enabling and disabling said amplifying means;
    floating means for maintaining said pair of complementary data lines in a floating condition when said amplifying means is put in a disabled condition by said enable means; and
    short-circuit means for short-circuiting said pair of complementary data lines when said amplifying means is put in said disabled condition,
    wherein said short-circuit means short-circuits said pair of complementary data lines in synchronism with an enable signal for putting said amplifying means into the disabled condition,
    wherein said amplifying means includes a differential circuit comprising a pair of bipolar transistors having their base connected to said pair of complementary data lines, respectively, and
    wherein said enable means includes level converting means for receiving said enable signal and for converting a level of said enable signal, and further includes delay means for receiving said enable signal to delay said enable signal in correspondence to a delay time occurring in said level converting means, the delayed enable signal being supplied to said short-circuit means.

2. A semiconductor memory device claimed in claim 1 wherein said floating means includes a pair of emitter follower transistors having their base connected to receive said pair of differential signals read from said memory cell, respectively, and a pair of current sources connected to an emitter of said emitter follower transistors and on-off controlled in response to said enable signal.

3. A semiconductor memory device claimed in claim 2 wherein said pair of complementary data lines are connected through a wired-OR to a plurality of pairs of emitter follower transistors.

4. A semiconductor memory device claimed in claim 3 further including a short-circuit canceling means for canceling the short-circuiting between said pair of complementary data lines after a potential on said pair of complementary data lines changes in accordance with said pair of differential signals read from said memory cell.

5. A semiconductor memory device claimed in claim 2,
    wherein said short-circuit means is also for setting said pair of complementary data lines to a predetermined voltage.

6. A semiconductor memory device claimed in claim 5 wherein said predetermined voltage is a voltage near to an emitter bias voltage of said emitter follower transistors when said emitter follower transistors are in operation.

* * * * *